(12) United States Patent
Smith et al.

(10) Patent No.: US 7,313,731 B2
(45) Date of Patent: Dec. 25, 2007

(54) SYSTEMS AND METHODS FOR IDENTIFYING ERRONEOUS TRANSACTIONS

(75) Inventors: Zachary Steven Smith, Ft. Collins, CO (US); John Warren Maly, Laporte, CO (US); Ryan Clarence Thompson, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 805 days.

(21) Appl. No.: 10/700,289

(22) Filed: Nov. 3, 2003

(65) Prior Publication Data

US 2005/0097404 A1    May 5, 2005

(51) Int. Cl.
    *G06F 11/00*    (2006.01)
(52) U.S. Cl. .......................................... 714/34; 714/37
(58) Field of Classification Search ................. 714/21, 714/23, 24, 34, 37, 51
    See application file for complete search history.

(56) References Cited

U.S. PATENT DOCUMENTS

| | | | | |
|---|---|---|---|---|
| 5,146,460 A | * | 9/1992 | Ackerman et al. | 714/33 |
| 5,732,247 A | * | 3/1998 | Dearth et al. | 703/13 |
| 5,935,226 A | * | 8/1999 | Klein | 710/303 |
| 6,351,754 B1 | * | 2/2002 | Bridge et al. | 707/202 |
| 6,526,447 B1 | * | 2/2003 | Giammaria | 709/232 |
| 6,591,389 B1 | * | 7/2003 | Daudelin et al. | 714/733 |
| 7,065,538 B2 | * | 6/2006 | Aronoff et al. | 707/202 |
| 2003/0046612 A1 | * | 3/2003 | Grey | 714/38 |
| 2004/0024949 A1 | * | 2/2004 | Winkler et al. | 710/315 |
| 2004/0128652 A1 | * | 7/2004 | Mandava et al. | 717/124 |
| 2004/0133409 A1 | * | 7/2004 | Mukherjee et al. | 703/14 |

* cited by examiner

*Primary Examiner*—Gabriel Chu (57) ABSTRACT

Disclosed are systems and methods for identifying erroneous transactions. In one embodiment, a system and a method pertain to monitoring an interface, determining information related to termination of a test case, and after the test case has terminated, identifying an incomplete transaction that should have completed prior to termination of the test case.

22 Claims, 5 Drawing Sheets

SYSTEMS AND METHODS FOR IDENTIFYING ERRONEOUS TRANSACTIONS

BACKGROUND

Computer processor design is an extremely complex and lengthy process. The design process includes a range of tasks from high level tasks such as specifying the architecture down to low level tasks such as determining the physical placement of transistors on a silicon substrate. Each stage of the design process also involves extensive testing and verification of the design through that stage. One typical stage of processor design is to program the desired architecture for the processor using a register transfer language (RTL). The desired architecture is represented by an RTL specification that describes the behavior of the processor in terms of step-wise register contents. The RTL specification models what the processor does without describing the physical circuit details. Thus, the processor architecture can be verified at a high level with reference to the RTL specification, independent of implementation details such as circuit design and transistor layout. The RTL specification also facilitates later hardware design of the processor.

Manually verifying the RTL specification of the processor architecture is prohibitively complex during the design of a modern microprocessor. Therefore, multiple test cases are typically generated to test the design. Each test case contains input instructions and may also contain the desired results or outputs. Rather than running test cases through a simulation of the RTL specification and manually verifying the results, the test cases may be executed both on a simulation of the RTL specification (often compiled to increase speed) and on a "golden simulator" and the results compared. The golden simulator (GSIM) is a relatively-high level simulation of the processor architecture and therefore has a higher likelihood of accurately implementing the desired architecture than the RTL specification. The golden simulator may be implemented in any desired manner, such as a custom program written using a high-level programming language. Although the golden simulator is often a higher-level implementation of the processor architecture than the RTL specification, the golden simulator typically does go into enough detail to match the major structures in the RTL specification. For example, if the RTL specification describes a translation look aside buffer (TLB), the golden simulator may also implement a TLB to enable full testing and comparison of the RTL specification.

Test cases may thus be executed both on the RTL specification and the golden simulator, so that the results can be compared. Any difference in the results indicates an error in the RTL specification, the golden simulator, or both, although in theory the golden simulator is more likely to be error-free than the RTL specification.

In an actual processor, processing continues without end until the processor is powered down. In the case of processor verification testing, however, the test case must terminate at some point in time. Once the test case so terminates, there may be various transactions that are still pending. In particular, there may be transactions that were initiated during the testing but that did not complete as defined by finish criteria established for the given transactions. Although such pending transactions may be legitimate transactions, for instance transactions that were initiated after termination was asserted but during execution of a code sequence that is performed before all processing ceases, other pending transactions may comprise erroneous transactions that should have completed but did not due to an error. Therefore, a system and method for identifying such erroneous transactions is needed so that the existence of such errors can be identified to the processor designer.

SUMMARY

Disclosed are systems and methods for identifying erroneous transactions. In one embodiment, a system and a method pertain to monitoring an interface, determining information related to termination of a test case, and after the test case has terminated, identifying an incomplete transaction that should have completed prior to termination of the test case.

BRIEF DESCRIPTION OF THE DRAWINGS

The disclosed systems and methods can be better understood with reference to the following drawings. The components in the drawings are not necessarily to scale.

DETAILED DESCRIPTION

Figure 1:
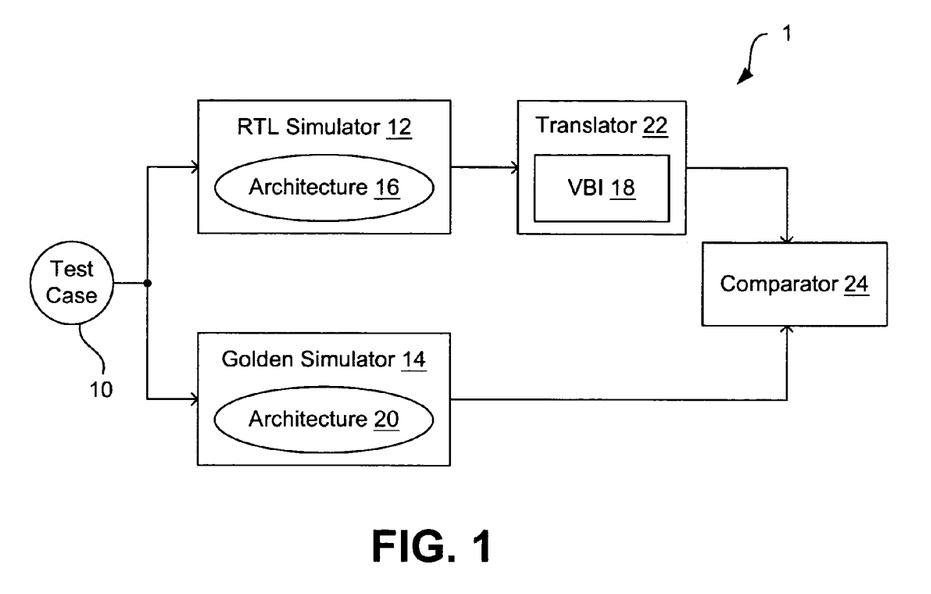
FIG. 1 is a block diagram of an exemplary system for verifying a processor architecture.

Disclosed are systems and methods for identifying erroneous transactions of a simulated processor architecture. Referring to FIG. 1, a processor architecture verification system 1 is illustrated that verifies processor architecture by executing at least one test case 10 on both a register transfer language (RTL) simulator 12 that comprises a compiled version of the RTL specification, and a golden simulator 14 that comprises a relatively high-level program that emulates operation of the processor. The RTL simulator 12 and the golden simulator 14 both simulate the desired architecture 16 and 20, respectively, of the processor. However, because the output of the RTL simulator 12 and the golden simulator 14 are in different formats, as will be discussed below, a translator 22 translates the output of the RTL simulator to match the format of the golden simulator. Notably, the output of the golden simulator 14 may instead be translated to match the format of the RTL simulator 12.

The translated output of the RTL simulator 12 (translated by the translator 22) is compared with the output of the golden simulator 14 in a comparator 24. If any differences in the outputs are detected by the comparator 24, the processor designer is alerted to the fact that an error may exist in the RTL simulator 12 or the golden simulator 14 or both. This enables test cases to be applied to the processor architecture quickly while minimizing required designer attention.

In the exemplary embodiment described herein, the golden simulator 14 is designed with a front side bus (FSB) output interface, while the RTL simulator 12 is designed with a point-to-point (P2P) link network output interface, as will be described in more detail below. The translator 22 comprises a virtual bus interface (VBI 18) that translates transactions from the RTL simulator 12 from P2P link network format to FSB format for comparison with the FSB format output of the golden simulator 14.

In some cases, the same golden simulator 14 may be used in the design of more than one processor, such as a family of processors all sharing the same underlying architecture. For instance, if the golden simulator 14 is designed with a given output interface in mind and a new processor is designed with a different output interface, the translator 22 enables the same golden simulator 14 to be used with the RTL simulator 12 for the new processor.

In some embodiments, the translator 22 de-pipelines the output of the RTL simulator 12 for comparison with the output of the golden simulator 14. In such an embodiment, the translator 22 may be referred to as a "depiper" for de-pipelining the output of the RTL simulator 12. The output of the RTL simulator 12 is de-pipelined in such an embodiment because the golden simulator 14 is more abstract than the RTL simulator 12. In particular, the golden simulator 14 does not include the same level of detail about the processor architecture being verified as does the RTL simulator 12. For example, the architecture, as simulated by the RTL simulator 12, may be superscalar and highly pipelined, while the golden simulator 14 simulates the architecture without this level of detail. The result is that many, e.g., 20 or 30, instructions may be acting on the RTL simulator 12 simultaneously such that the output of the RTL simulator does not match the output of the golden simulator 14 directly, even though the underlying architecture is the same and the test case is identical.

The RTL simulator 12 and the golden simulator 14 are operated relative to information specified by the test case 10. In one exemplary embodiment, the test case 10 comprises a program to be executed on the processor architecture 16 and 20 in the RTL simulator 12 and golden simulator 14. The test case program is a memory image of one or more computer executable instructions, along with an indication of the starting point, and may comprise other state specifiers such as initial register contents, external interrupt state, etc. Accordingly, the test case 10 defines an initial state for the processor that is being simulated and the environment in which it operates. The test case 10 may be provided for execution on the RTL simulator 12 and golden simulator 14 in any suitable manner, such as an input stream or an input file specified on a command line.

The RTL specification used to generate the RTL simulator 12 is, for example, implemented using the iHDL hardware description language, from the Intel Corporation of Santa Clara, Calif. Alternatively, the RTL specification may be implemented using any suitable tool for modeling the processor architecture 16, such as any register transfer language description of the architecture, which may be interpreted or compiled to act as a simulation of the processor. The RTL simulator 12 of an exemplary embodiment contains an application program interface (API) that enables external programs, including the translator 22, to access the state of various signals in the simulated processor such as register contents, input/outputs (I/Os), etc. Thus, the output of the RTL simulator 12 may be produced in any of a number of ways, such as an output stream, an output file, or as states that are probed by an external program through the API. The RTL simulator 12 may simulate any desired level of architectural detail, such as a processor core, or a processor core and one or more output interfaces.

As noted above, the golden simulator 14 of the exemplary embodiment is a relatively abstract, higher-level simulation of the processor architecture 20, and therefore may be less likely to include faults or errors than the RTL simulator 12. The golden simulator 14 is written using a high level programming language such as C or C++. Alternatively, the golden simulator 14 may be written using any other suitable programming language, whether compiled, interpreted, or otherwise executed. Whereas the RTL simulator 12 actually matches the details and reality of the processor being simulated to a great degree, the golden simulator 14 is a conceptual model without concern for timing considerations arising from physical constraints.

Figure 2:
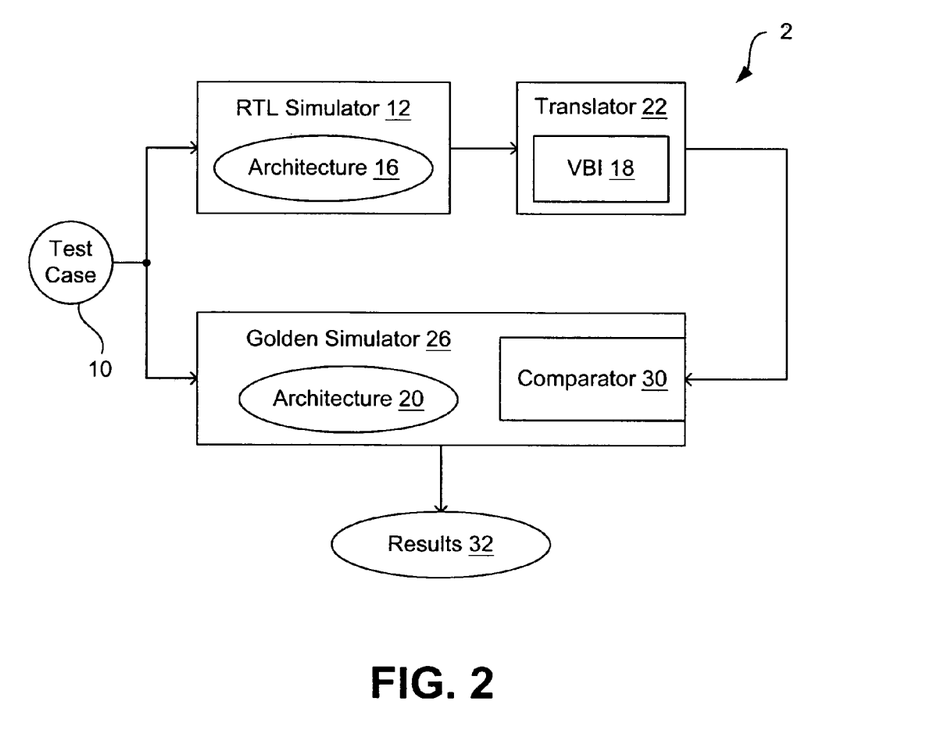
FIG. 2 is a block diagram of an alternative exemplary system for verifying a processor architecture.

The tasks to be performed in the architecture verification system may be divided as desired. For example, in an alternative embodiment illustrated in FIG. 2, a processor architecture verification system 2 includes a golden simulator 26 that contains a comparator 30. In the embodiment of FIG. 2, the test case 10 is executed by the RTL simulator 12 and the golden simulator 26. The results of the RTL simulator 12 are translated by the translator 22, and are fed into the golden simulator 26. The comparator 30 in the golden simulator 26 then compares the results of the golden simulation and the translated results from the RTL simulator 12, and the results 32 are made available by the golden simulator.

The translator design depends on the output formats of the RTL simulator 12 and golden simulator 14 or 26. In one exemplary embodiment, the output of the RTL simulator 12 and golden simulator 14, 26 differs due to pipeline differences in the models as well as due to different output interfaces. The RTL simulator 12 includes architectural details such as the highly-pipelined, superscalar nature of the processor. Thus, a large number of instructions may be acting on the processor at one time. In contrast, the golden simulator 14, 26, although based on the same architecture being verified, is modeled without pipelines as a simple in order machine that processes a single instruction at a time. As described above, the translator 22, in some embodiments, includes a depiper that de-pipelines the data and events in the RTL simulator 12. The output of the RTL simulator 12 is thus simplified to appear as if it were generated by a simple in-order machine, thereby enabling the comparator (e.g., 24 or 30) to compare the translated results of the RTL simulator with the results of the golden simulator 14, 26. An exemplary depiper is described in U.S. Pat. No. 5,404,496, which is incorporated by reference herein for all that it discloses.

When provided, the depiper tracks instructions as they flow through the RTL simulator 12 and notes their effects on the simulated processor. The depiper may generate a retire record for each instruction that indicates when the instruction started executing and when it completed or retired, along with the states that changed during execution. In some cases, if state changes cannot be tracked to a single instruction, the depiper may generate a generic report identifying an altered state and the instructions that may have caused the change. Thus, the output of the RTL simulator 12 is simplified for comparison with the golden simulator 14, 26.

In embodiments in which the translator 22 includes a depiper the VBI 18 works in parallel with the depiper in the translator, with the depiper producing state change records such as depiper retire records, and the VBI producing state change records in the form of synthesized FSB transactions. Although the VBI 18 may read the P2P packets directly from the P2P interface on the RTL simulator 12 and may access information about the RTL simulated processor via the API, the VBI may also access information about the RTL simulated processor that is stored in the depiper. In some embodiments, the depiper contains structures that monitor the simulated processor core's states. In such cases, it may be convenient for the VBI 18 to access some information from the depiper for use in reporting or synthesizing fields used in the FSB phases.

In other embodiments in which the translator 22 includes a depiper, the depiper first reads the P2P output of the RTL simulator 12 and de-pipelines the P2P transactions, generating a de-pipelined version of the P2P transactions. The VBI 18 then reads the depipelined version of the P2P transactions from the depiper and generates corresponding FSB transactions for the comparator 24 or 30. The de-pipelined P2P transactions may be transferred from the depiper to the VBI 18 in any suitable manner, such as across a virtual P2P link or in a file containing depiper retire records.

The VBI 18 is not limited to use with verification systems including a depiper. Verification systems having the same level of pipelining detail in both the RTL simulator 12 and the golden simulator 14, 26 may not need a depiper, but a VBI 18 still enables processor simulators with different output interfaces to be used together. If the translator 22 includes a depiper, the VBI 18 may access information stored in the depiper as described above, or may be implemented as a module in the depiper for convenience. In embodiments in which the translator 22 does not include a depiper, the VBI 18 in the translator 22 still directly connects to the P2P output of the RTL simulator 12, but obtains other information about the state of the simulated processor from the RTL simulator via the API. The VBI 18 uses the resulting P2P packets and other information to produce translated FSB transactions in whatever manner required by the comparator 24, 30, such as generating a virtual FSB connection to the comparator, or generating output reports containing records of FSB format transactions that may be read by the comparator.

Figure 3:
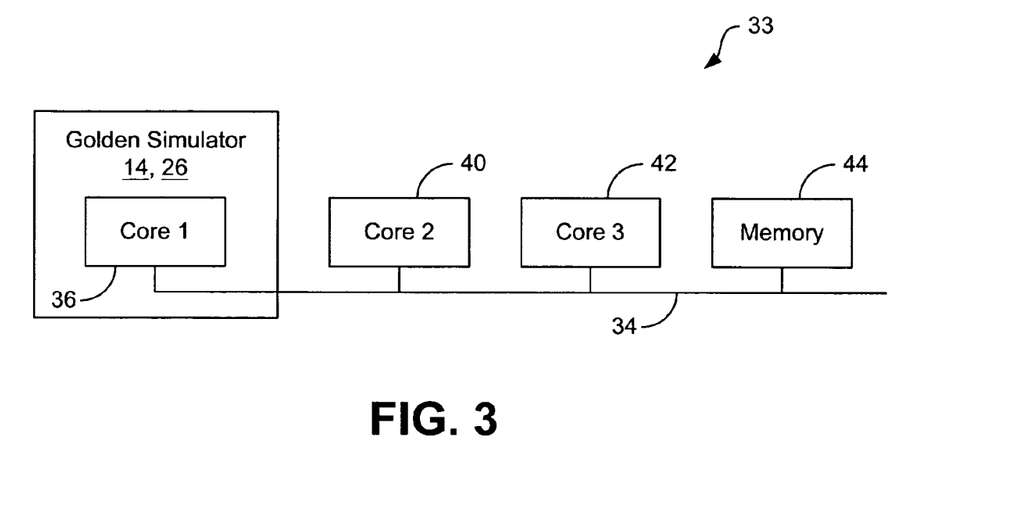
FIG. 3 is a block diagram of an exemplary system of computer components connected by a front side bus.

Exemplary output interfaces of the RTL simulator 12 and the golden simulator 14, 26 will now be described in more detail, as will the VBI 18 in the translator 22. FIG. 3 illustrates an example output interface 33 for the golden simulator 14, 26. As shown in that figure, the golden simulator 14, 26 uses a front side bus 34 (FSB) In the embodiment of FIG. 3, a simulated processor core 36, Core 1, based on the desired architecture 20 and simulated in the golden simulator 14, 26, is connected to the FSB 34 and therefore to external components such as other simulated processor Cores 2 and 3 (40 and 42), a memory 44, etc. Those external components 40, 42, and 44 may comprise actual physical devices. For example, the memory 44 may be a portion of the memory of the computer executing the golden simulator 14, 26. Alternatively, one or more of the external components 40, 42, and 44 may be simulated components that are either simulated by the golden simulator 14, 26 or by an external simulator. Alternatively, one or more of the external components 40, 42, and 44 may be virtual components represented by pre-programmed responses in the test case 10 that are issued by the golden simulator 14, 26 in response to transactions from the simulated Core 1 (36).

The FSB 34 is a broadcast bus in which bus traffic is visible to each component connected to the FSB and each component monitors the traffic to determine whether the traffic is addressed to them. An exemplary operation or "transaction" performed by Core 1 (36), such as a memory read operation, may comprise multiple phases. For example, consider an exemplary read operation performed by the Core 1 (36) using the FSB 34 to read data from the memory 44. The exemplary transaction comprises an arbitration phase, a request A, a request B, a snoop phase, and a data phase. Each of these five phases is performed by transmitting or receiving a block of information over the FSB 34. The comparator 24 or 30 expects to see a report for each of the five phases that acts as a state input to be compared against inputs generated by the golden simulator 14, 26. The different phases are defined in the FSB output format and place the system into various states. For example, during the snoop phase, the transaction becomes globally visible so that the transaction is visible to each core 36, 40, and 42, thereby facilitating a shared memory architecture (SMA).

Figure 4:
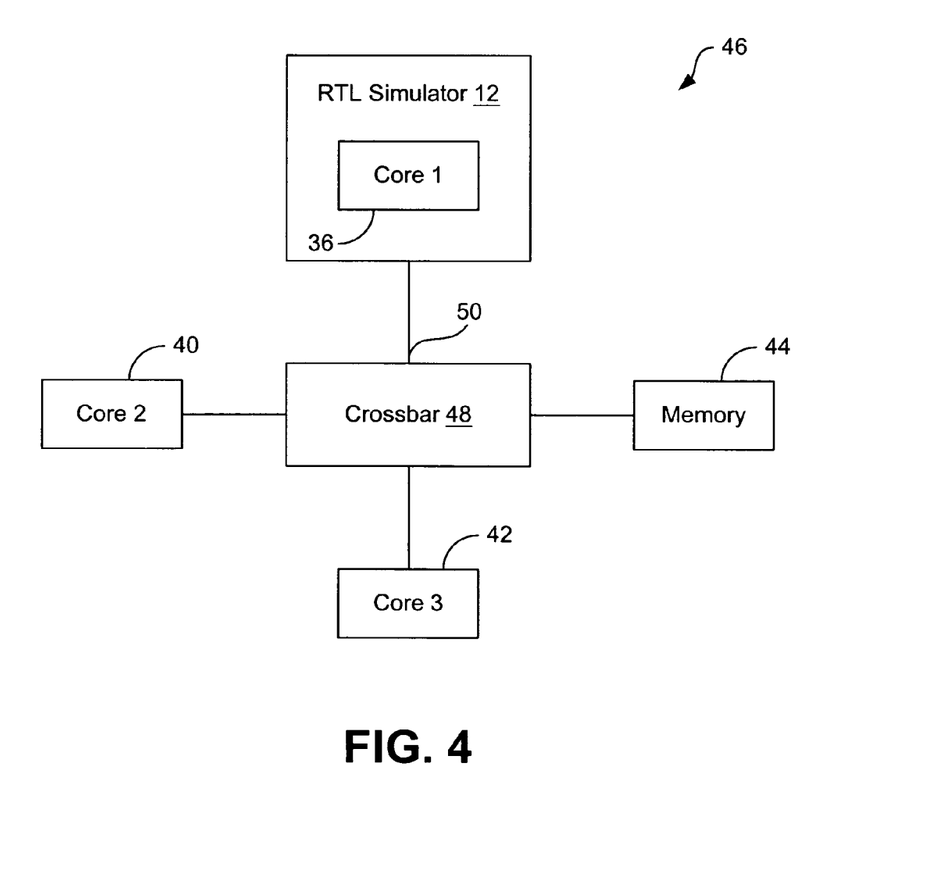
FIG. 4 is a block diagram of an exemplary system of computer components connected by a point-to-point link network.

In contrast, the RTL simulator 12 of the exemplary embodiments uses one or more ports into a point-to-point (P2P) link network 46 shown in FIG. 4. With reference to FIG. 4, the P2P link network 46 is a switch-based network with one or more crossbars 48 acting as switches between components such as processor cores 36, 40, and 42, memory 44, or other devices. Transactions are directed to specific components and are appropriately routed in the P2P link network 46 by the crossbar 48. This operation of the crossbar 48 reduces the load on the system components because they do not need to examine each broadcast block of information as with the FSB 34. Instead, each component ideally receives only data meant for that component. Use of the crossbar 48 also avoids bus loading issues that can plague FSB systems. Therefore the P2P link network 46 facilitates better scalability. Transactions on the P2P link network 46 are packet-based, with each packet containing a header with routing and other information. Packets containing requests, responses, and data are multiplexed so that portions of various transactions may be executed with many others at the same time. Transmissions are length limited, with each length-limited block of data called a "flit." Thus, a long packet will be broken into several flits, and transactions will typically require multiple packets. Therefore, the P2P link network 46 is monitored over time to collect the appropriate P2P packets until enough information exists for a corresponding FSB phase to be generated by the translator 22.

The translator VBI 18 translates entire transactions by reading the P2P packets and generating corresponding FSB phases for the transaction so that the transactions can be compared by the comparator 24, 30 with transactions from the golden simulator 14, 26. The translator 22 may be designed to only monitor packets passing in and out of the simulated Core 1 (36), and/or may monitor other packets in the P2P link network 46 if desired. In the exemplary embodiment illustrated in FIG. 4, the translator 22 monitors the port 50 on the crossbar 48 that is connected to the simulated Core 1 (36) in the RTL simulator 12.

Figure 5:
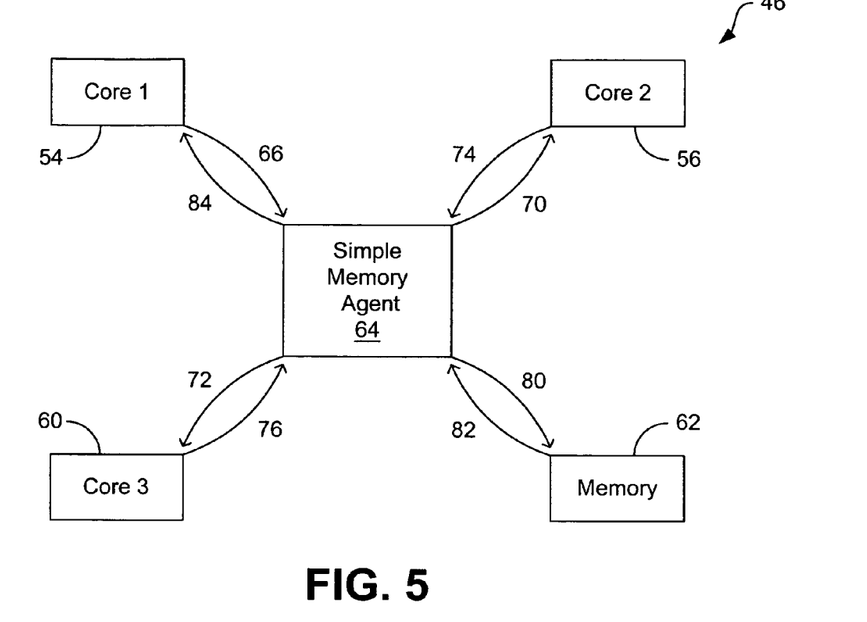
FIG. 5 is a block diagram illustrating exemplary logical data flow in a point-to-point link network between a group of processor cores and a memory, illustrating a read operation coordinated by a simple memory agent.

An exemplary read operation in a P2P link network is illustrated in FIG. 5. The P2P link network 52 in this example comprises three simulated processor cores 54, 56, and 60 (i.e. Cores 1, 2, and 3), a memory 62, and a simple memory agent 64. (Note that the diagram of FIG. 5 illustrates logical data flow, not physical connections, and that a crossbar through which all packets flow is not shown.) The first core 54 (Core 1) is simulated in an RTL simulator, although the other components 56, 60, 62, and 64 may also be simulated as discussed above. The term "data line" refers to a line of data, such as a computer-executable instruction line, which is stored in the memory 62 and copies of which may also be temporarily stored in caches in one or more of the cores 54, 56, and 60. The term "simple" with respect to the simple memory agent 56 indicates that no directory of data line locations exists, such that the simple memory agent 56 is unaware of which component in the system is holding the controlling version of any given data line.

During the read operation, Core 1 (54) sends a packet 66 to the simple memory agent 64 requesting a line of data. Because the system does not include a directory, the simple memory agent 64 does not know where the controlling version of the line being read is located. Therefore, the simple memory agent 64 sends packets 74 and 72 to each of the other cores 56 and 60 (i.e. Cores 2 and 3), respectively, inquiring as to whether those cores contain a controlling copy of the line. Assuming in this example that they do not, each core 56, 60 responds with a packet 70 and 76, respectively, indicating that they do not have a copy of the line. The simple memory agent 64 then sends a packet 80 to the memory 62, which responds with a packet 82 containing the line to the simple memory agent 64. The simple memory agent 64 then sends a packet 84 containing the line to the requesting core 54.

Each of the packets described in the above example may be divided into multiple flits. Furthermore, depending on the particular protocol of the P2P link network, additional packets may be transmitted over the P2P link network 52 during the transaction, for example to indicate that the transaction is complete. Thus, packets in the P2P link network format are formatted and divided much differently than corresponding FSB phases of a transaction, and each may include information not provided in the other format.

An example of the operation of the translator 22 will now be described. It is noted that multiple P2P packets and FSB phases may be involved in a single transaction such as a read or write operation. Furthermore, a transaction may be divided differently in the P2P and FSB formats. Therefore, the translator 22 translates by transaction rather than by P2P packet in the following exemplary operation. However, not all P2P packets for a given transaction need be received before beginning to generate corresponding FSB phases for the transaction. For example, after receiving the second P2P packet in a five-packet transaction, it may be possible to generate the second corresponding FSB phase if sufficient information has been received.

The translator 22 monitors each virtual channel, both incoming and outgoing, on each selected P2P port. For example, the translator 22 may be configured to monitor all input and output ports on the simulated processor core. The translator 22 tracks the ports clock tick by clock tick. The clock may be a source clock in the P2P output interface of the simulated core, a clock signal in the virtual P2P link network wires, etc. The translator 22 first assembles transmissions into packets, which may comprise receiving multiple flits to form a packet, as described above.

When a packet has been received, its header is examined to see if the packet type is one that indicates that the packet should be translated or discarded. Only P2P packets corresponding to an FSB phase in a transaction are translated. For example, flow control packets or bus status packets relating to the P2P link network 46 that have no analogue in the FSB protocol are not translated. When the first packet of a transaction has been received, a packet list for that transaction is created to contain or identify all received packets for that transaction. When additional packets for that transaction are received, they are added to the appropriate packet list. The transactions being translated are managed and accessed by an associative array containing pointers to the packet lists for each transaction. Each transaction is assigned a transaction identifier or ID, "txnid," which is used as an index into the associative array, as follows: transactionx {txnid}. The first entry in the packet list for each transaction contains information about the transaction, such as the transaction type (e.g., read, write, interrupt) and location, whether the packet is incoming or outgoing, timing information, and the port and channel. Each transaction that has had some activity during the current clock tick is marked as active using another associative array as follows: active{txnid}=1.

Once all monitored channels have been processed as described above for the current clock tick, the list of active transactions for this clock tick is processed to determine if an FSB phase may be generated based on the information received to this point. The type of each active packet list is noted, and each active packet list is scanned to determine whether, based on the packet type, an FSB phase for the transaction can be generated. If an FSB phase is generated based on packets in the packet list, the packet list is annotated to indicate that the FSB phase has been generated, preventing later generation of a duplicate FSB phases. Lookup tables are used in the exemplary translator 22 to generate FSB phases corresponding to one or more P2P packets. Meta-informational values in the FSB phases are translated from the packet list as well, such as request step time, a unique FSB transaction number, etc. FSB fields such as transaction type, address, code, write-snoop, lock, drv_ads, length, attribute, hit, hitm, etc., may be filled in with default values, or using a lookup table to translate from values in the packet list, or synthesizing new information. This synthesizing may be performed by using the transaction/packet type in the translation function, reading signals from other parts of the simulation, or from other information. For example, the signal delay from a data bus to a control path may be added to an observability time. Packets other than those triggering a reporting event may also be examined to determine proper field contents. It is also noted that some information may not need to be included in FSB phases if the information is not needed by the comparator 24 for verifying the simulated core. In such cases, dummy values may be inserted. The translator 22, 30 may also perform any other appropriate functions such as rearranging the byte/word order in a line of data because of critical-chunk differences in the output interfaces, or changing the reported "completion time" based on the type of transaction. Once a transaction has been completely translated, it is removed from the active list of transactions being processed. The active transaction list is also cleared at the end of translation processing for a clock tick to prepare for the next clock tick.

As discussed above, translation details are dependent upon the differences between the golden simulator 14, 26 and the RTL simulator 12, such as the output interfaces and the level of architectural detail included in each. It will therefore be understood that the translator 22 may be adapted by one skilled in the art based upon the differences between the golden simulator 14, 26 and the RTL simulator 12.

Figure 6:
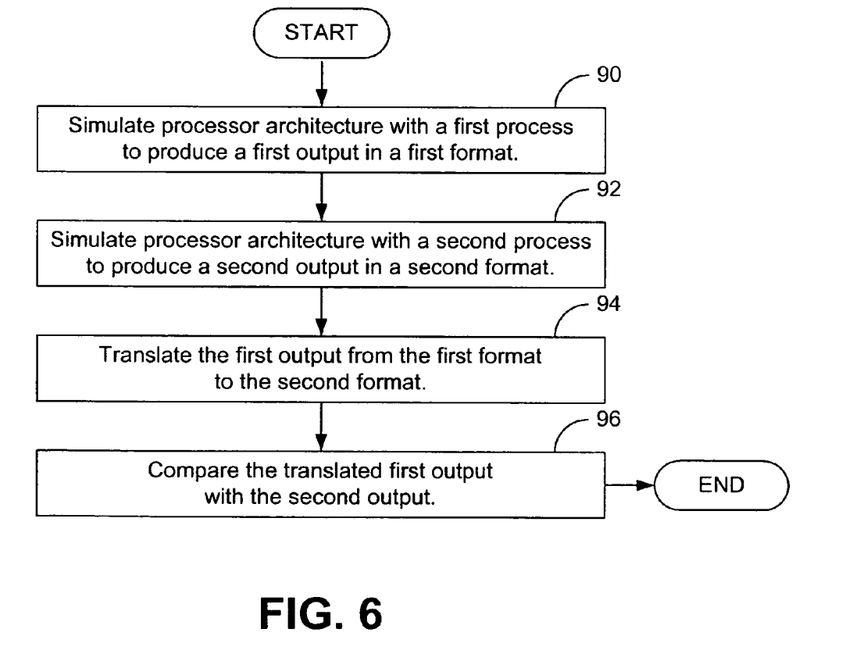
FIG. 6 is a flow diagram of an exemplary operation for verifying a processor architecture.

In summary, the architecture of a processor design may be verified by simulating the processor architecture with a first process 90 (FIG. 6) to produce a first output in a P2P link network format and with a second process 92 to produce a second output in a FSB format. For example, as described above with respect to one exemplary embodiment, the first process may comprise an RTL simulation of a highly pipelined processor with a P2P link network output, the second process may comprise a golden simulation of a simple in-order machine that processes a single instruction at a time, with an FSB output, both based on the same architecture. The first output is translated 94 from the P2P link network format to the FSB format, and the translated first output is compared 96 with the second output.

As noted above, certain transactions that are pending when a test model is terminated may comprise erroneous transactions that should have completed but did not due to an error, for example in the processor design. Such erroneous transactions may not be detected in P2P interfaces, such as that used in the RTL simulator 12. Unfortunately, the golden simulator 14, 26 is unlikely to identify such erroneous transactions given its relatively high-level nature. Therefore, the processor designer may not be alerted to the fact that a given transaction did not complete and, therefore, that there may be a flaw in the processor design. As is described below, however, such erroneous transactions can be detected if the VBI 18 is configured to analyze the transactions that are pending when termination of the test case is asserted.

Figure 7:
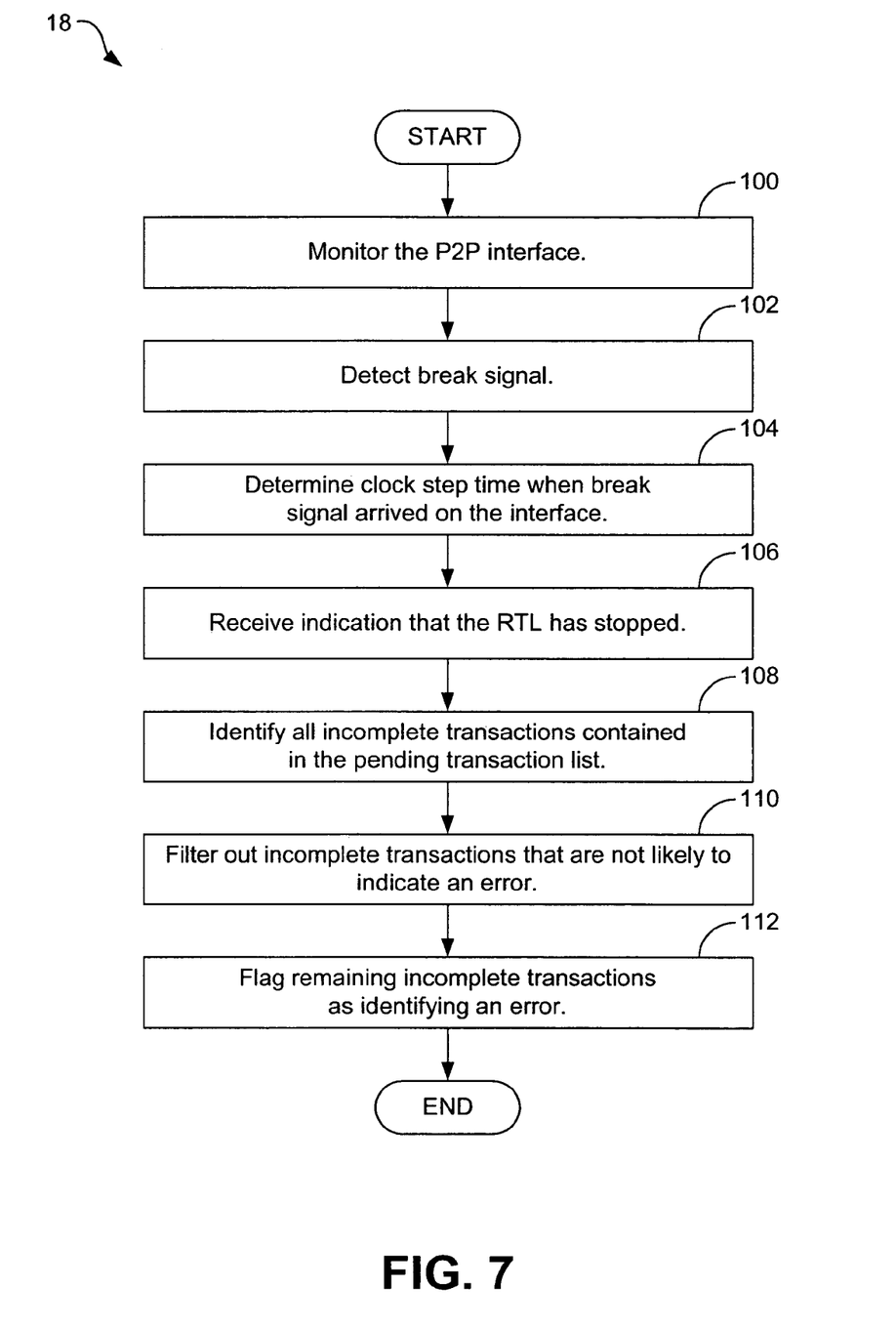
FIG. 7 is flow diagram of an example of operation of a virtual bus interface in identifying erroneous transactions.

FIG. 7 provides an example of operation of the VBI 18 in identifying transactions that are pending after termination of the test case is asserted. More particularly, FIG. 7 provides an example of the VBI 18 in identifying erroneous transactions that are pending on a P2P interface, such as that of the RTL simulator 12. Beginning with block 100 of FIG. 7, the VBI 18 monitors the P2P interface. In particular, the VBI 18 examines all channels on each interface port of the P2P interface so as to identify all traffic that is transmitted over the interface. Therefore, as indicated in block 102, the VBI 18 can detect a break signal. By way of example, such a signal can be asserted by the translator depiper after the depiper detects a break command having been issued by observing a case-ending sequence being executed. Once having detected that signal, the VBI 18 determines the clock step time when the break signal arrived on the interface, as indicated in block 104.

As noted above, processing does not immediately cease upon issuance of the break command. Instead, one or more code sequences may be executed to implement the cessation analogous to a computer shut-down sequence. Once such code sequence(s) has/have been executed, the VBI 18 receives an indication that the test model, e.g., RTL simulator 12, has stopped processing, as indicated in block 106. By way of example, that indication can also be provided to the VBI 18 by the translator depiper.

At this point, the VBI 18 identifies all pending transactions that are contained in the pending transaction list, as indicated in block 108. As noted above, one or more of those pending transactions may be legitimate. Therefore, as indicated in block 110, the VBI 18 filters out pending transactions that appear to be legitimate, i.e. are not likely to indicate an error, prior to making any determinations as to erroneous transactions. An example of transactions that are not likely to indicate an error include transactions that were initiated at the time the break was asserted or thereafter in that such transactions would not be expected to terminate in such a short period of time (i.e. number of clock ticks). Also unlikely to indicate an error are, for example, code fetches, port read line code (PRLC) operations, port read line code with self-snoop (PRLCSS) operations, and the like in that such transactions may pertain to the code sequence(s) that is/are executed after issuance of the break command. Accordingly, the VBI 18 may filter the transactions contained in the pending transaction list by disregarding (i) transactions having a start time on or after the clock step time determined in block 104 (i.e. the time at which the break signal arrived on the interface), (ii) all code fetches, and (iii) any other transaction that, due to the configuration and/or operation of the test model (e.g., RTL simulator 12), may legitimately not have completed after issuance of the break command.

Once the above-described filtering has been performed by the VBI 18, any remaining pending transactions may be considered suspect in that, at least in theory, all transactions other than those filtered out by the VBI should have completed by the time the break command was issued or by the time processing ceased. Accordingly, with reference to block 112, the VBI 18 flags all remaining pending transactions as erroneous. Notably, the existence of an erroneous transaction may indicate an error in the processor design (and the RTL specification), the VBI 18, or a tool used to simulate a system component (e.g., a memory or a core). Alternatively or in addition, such an erroneous transaction may simply indicate that the transaction is otherwise spurious.

Irrespective of the cause of the erroneous transaction, flagging the transaction alerts the processor designer (or other user) as to the potential problem, as well as provides the user with information that can be used to determine the reason for the erroneous transaction(s). Therefore, the flagging of the erroneous transaction may comprise one or more of providing (e.g., printing out) all completed packets associated with the transaction, and/or providing (e.g., printing out) a summary of the entire transaction which describes all processing associated with that transaction (e.g., arrival of packets, contents of packets, etc.). From the provided information, the processor designer may be able to identify what conditions and/or system agents caused the transaction to not complete and, potentially, how to remedy the problem.

Figure 8:
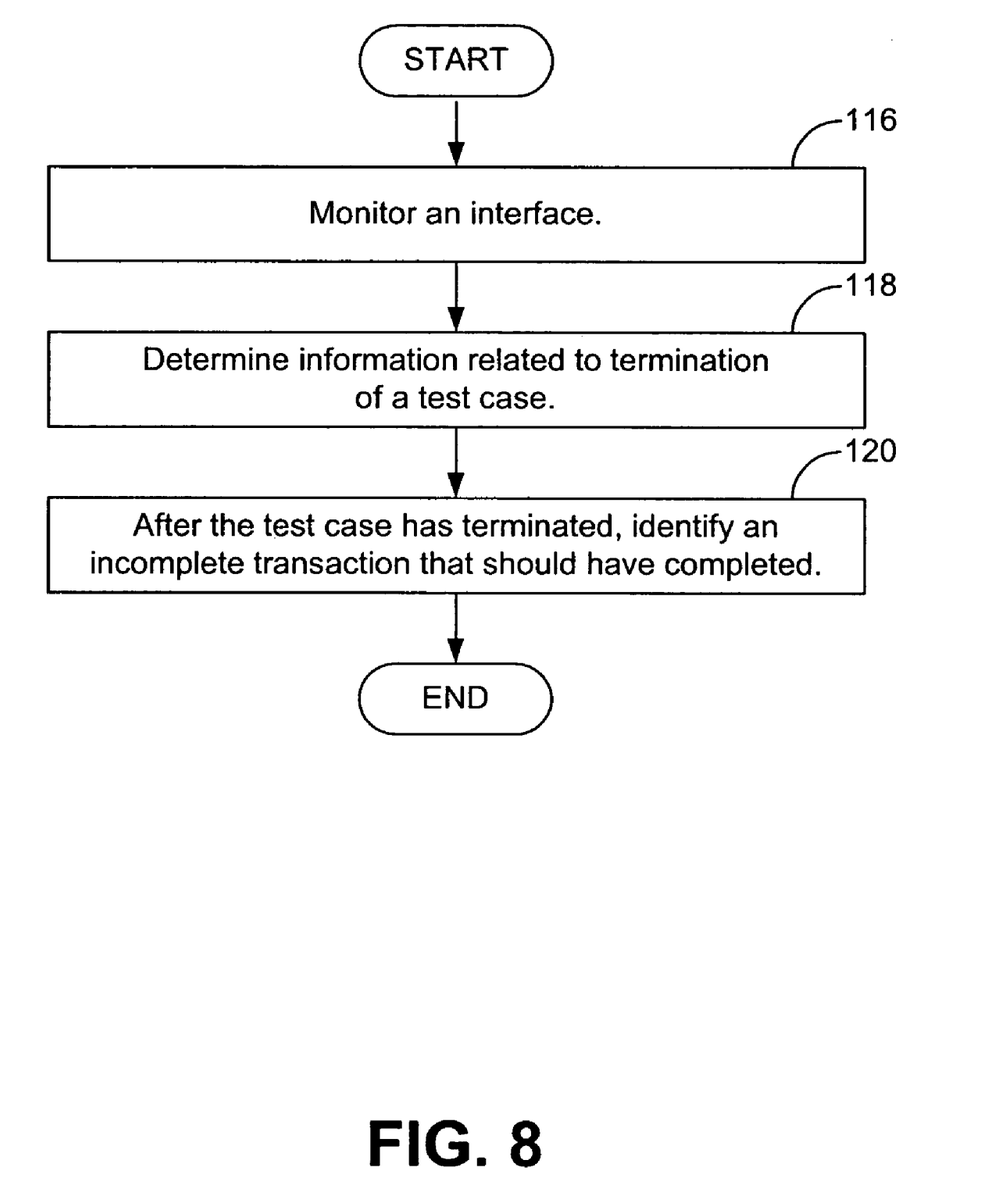
FIG. 8 is a flow diagram that summarizes a method for identifying an erroneous transaction.

In view of the above, a method for identifying erroneous transactions can be summarized as shown in FIG. 8. Such a method comprises monitoring an interface (block 116), determining information related to termination of a test case (block 118), and after the test case has terminated, identifying an incomplete transaction that should have completed (block 120).

Various computer-readable or executable code or electronically-executable instructions have been described herein. Such code or instructions may be implemented in any suitable manner, such as software, firmware, hard-wired electronic circuits, as the programming in a gate array, etc. Software may be programmed in any programming language, such as machine language, assembly language, or high-level languages such as C or C++. The computer programs may be interpreted or compiled.

Computer-readable code, executable code, or electronically-executable instructions may be tangibly embodied on any computer-readable storage medium or in any electronic circuitry for use by or in connection with any instruction-executing device, such as a general purpose processor, software emulator, application specific circuit, a circuit made of logic gates, etc. that can access or embody, and execute, the code or instructions.

Methods described and claimed herein may be performed by the execution of computer readable or executable code or electronically executable instructions, tangibly embodied on any computer-readable storage medium or in any electronic circuitry as described above.

A storage medium for tangibly-embodying computer readable code, executable code, or electronically-executable instructions includes any means that can store, transmit, communicate, or in any way propagate the code or instructions for use by or in connection with the instruction-executing device. For example, the storage medium may include (but is not limited to) any electronic, magnetic, optical, or other storage device, or any transmission medium such as an electrical conductor, an electromagnetic, optical, infrared transmission, etc. The storage medium may alternatively comprise an electronic circuit, with the code or instructions represented by the design of the electronic circuit. Specific examples include magnetic or optical disks, both fixed and removable, semiconductor memory devices such as memory cards and read-only memories (ROMs), including programmable and erasable ROMs, non-volatile memories (NVMs), optical fibers, etc. Storage media for tangibly-embodying code or instructions also include printed media such as computer printouts on paper which may be optically scanned to retrieve the code or instructions, which may in turn be parsed, compiled, assembled, stored and executed by an instruction-executing device. The code or instructions may also be tangibly embodied as an electrical signal in a transmission medium such as the Internet or other types of networks, both wired and wireless.

We claim:

1. A method for identifying erroneous transactions that occur during processor architecture verification testing, the method comprising:
    monitoring an interface;
    determining information related to termination of a test case; and
    after the test case has terminated, identifying an incomplete transaction that should have completed prior to termination of the test case by consulting a pending transactions list, filtering out pending transactions of a type that does not likely indicate an error, and flagging all pending transactions other than those that were filtered out.

2. The method of claim 1, wherein monitoring an interface comprises monitoring a point-to-point (P2P) link network.

3. The method of claim 1, wherein monitoring an interface comprises monitoring a point-to-point (P2P) link network of a register transfer language (RTL) simulator.

4. The method of claim 1, wherein determining information related to termination of a test case comprises detecting a break signal asserted on the interface.

5. The method of claim 1, wherein determining information related to termination of a test case comprises receiving an indication that a test model has stopped processing.

6. The method of claim 1, wherein filtering out pending transactions comprises disregarding at least one of transactions having a start time on or after the time at which a break signal was asserted and transactions that occur as a result of a break command being issued.

7. The method of claim 1, wherein flagging all other transactions comprises alerting a user as to the existence of the pending transactions and providing information to the user that can be used to determine the reason why those transactions did not complete.

8. The method of claim 7, wherein providing information comprises at least one of providing all completed packets associated with the transactions and providing a summary of each transaction that describes all processing associated with each transaction.

9. A system for identifying erroneous transactions, the system comprising:
    means for monitoring all ports of an interface;
    means for determining information related to termination of a test case;
    means for consulting a pending transactions list;
    means for filtering out transactions in the pending transactions list of a type that does not likely indicate an error; and
    means for flagging all transactions other than those that were filtered out.

10. The system of claim 9, wherein the means for monitoring comprise means for monitoring a point-to-point (P2P) link network of a register transfer language (RTL) simulator.

11. The system of claim 9, wherein the means for determining information comprise means for detecting break signals asserted on the interface.

12. The system of claim 9, wherein the means for determining information comprise means for receiving an indication that a test model has stopped processing.

13. The system of claim 9, wherein the means for filtering comprise means for disregarding at least one of transactions having a start time on or after the time at which a break signal was asserted and transactions that occur as a result of a break command being issued.

14. The system of claim 9, wherein the means for flagging comprise means for at least one of providing all completed packets associated with the transactions and providing a summary of each transaction that describes all processing associated with each transaction.

15. A virtual bus interface (VBI) stored on a computer-readable medium, the VBI comprising:
    logic configured to monitor a point-to-point (P2P) interface;
    logic configured to determine a time at which a break signal was asserted;
    logic configured to identify transactions that are pending after the break signal was asserted;
    logic configured to determine which of the pending transactions are erroneous; and
    logic configured to flag erroneous transactions.

16. The VBI of claim 15, wherein the logic configured to identify transactions comprises logic configured to consult a pending transactions list.

17. The VBI of claim 15, wherein the logic configured to determine comprises logic configured to filter out pending transactions of a type that does not likely indicate an error.

18. The VBI of claim 17, wherein the logic configured to filter out pending transactions comprises logic configured to disregard at least one of transactions having a start time on or after the time at which the break signal was asserted and transactions that occur as a result of a break command being issued.

19. The VBI of claim 15, wherein the logic configured to flag comprises logic configured to alert a user as to the existence of the erroneous transactions and logic configured to provide information to the user that can be used to determine the reason why those transactions did not complete.

20. A physical computer-readable medium that stores a processor architecture verification system, comprising:
    a register transfer language (RTL) simulator that simulates operation of a processor and generates a first output in a first format, the RTL simulator including an interface;
    a golden simulator that simulates operation of the processor and generates a second output in a second format;
    a translator that translates at least one of the outputs for comparison with the other output, the translator including a virtual bus interface (VBI) that comprises logic configured to monitor a point-to-point (P2P) interface, logic configured to determine a time at which a break signal was asserted, logic configured to identify transactions that are pending after a break command was issued by referencing a pending transactions list, and logic configured to determine which of the pending transactions are erroneous by filtering out pending transactions of a type that does not likely indicate an error; and a comparator that compares the first and second outputs after translation of the at least one output.

21. The computer-readable medium of claim 20, wherein the logic configured to determine which of the pending transactions are erroneous comprises logic configured to disregard at least one of transactions having a start time on or after the time at which the break signal was asserted and transactions that occur as a result of a break command being issued.

22. The computer-readable medium of claim 20, wherein the virtual bus interface (VBI) further comprises logic configured to flag erroneous transactions.

* * * * *